United States Patent
Ooaeh et al.

[11] Patent Number: 5,981,960
[45] Date of Patent: Nov. 9, 1999

[54] CHARGED PARTICLE BEAM EXPOSURE METHOD AND APPARATUS THEREFOR

[75] Inventors: Yoshihisa Ooaeh; Akio Yamada; Hiroshi Yasuda, all of Kawasaki; Hitoshi Tanaka, Tokyo, all of Japan

[73] Assignee: Fujitsu Limited, Kawasaki, Japan

[21] Appl. No.: 08/724,954

[22] Filed: Oct. 2, 1996

[30] Foreign Application Priority Data

Mar. 19, 1996 [JP] Japan ................................. 8-062421

[51] Int. Cl.⁶ ..................................................... H01J 37/30
[52] U.S. Cl. ........................................ 250/492.2; 250/398
[58] Field of Search ................................. 250/398, 492.2, 250/310

[56] References Cited

U.S. PATENT DOCUMENTS 5,312,519  5/1994  Sakai et al. .................................. 134/1
5,539,211  7/1996  Ohtoshi et al. ........................ 250/441.11

FOREIGN PATENT DOCUMENTS 61-59826  3/1986  Japan .
2-244719  9/1990  Japan .
5-109610  4/1993  Japan .

*Primary Examiner*—Bruce C. Anderson
*Attorney, Agent, or Firm*—Staas & Halsey LLP

[57] ABSTRACT

A charged particle beam exposure method and apparatus, in which a charged particle beam is shaped based on pattern data and the shaped charged particle beam is irradiated to a desired location on a sample. The method and apparatus includes introducing ozone gas into a chamber through which the charged particle beam is passed, shaped and deflected, to be irradiated to the desired location while the charged particle beam is irradiated through the chamber. The ozone gas concentration in the chamber is maintained so that the concentration downstream along the beam is higher than the concentration upstream along the beam. A charge-up drift due to a contamination material from a resist on a wafer can be avoided by the ozone self cleaning. The ozone oxidation does not occur at the upstream chamber where there is a lower ozone concentration and lower contamination.

21 Claims, 10 Drawing Sheets

ELECTRON BEAM EXPOSURE APPARATUS

ELECTRON BEAM EXPOSURE APPARATUS

ELECTRON GUN

RELATION BETWEEN EB AND FIRST & SECOND SLIT

EB SCATTERING

EB APPARATUS

EB APPARATUS

SUB-DEFLECTOR 34

AREA IN LENS BARREL VS CURRENT VALUE AND OZONE CONCENTRATION

APPARATUS OF ELECTRON BEAM EXPOSURE

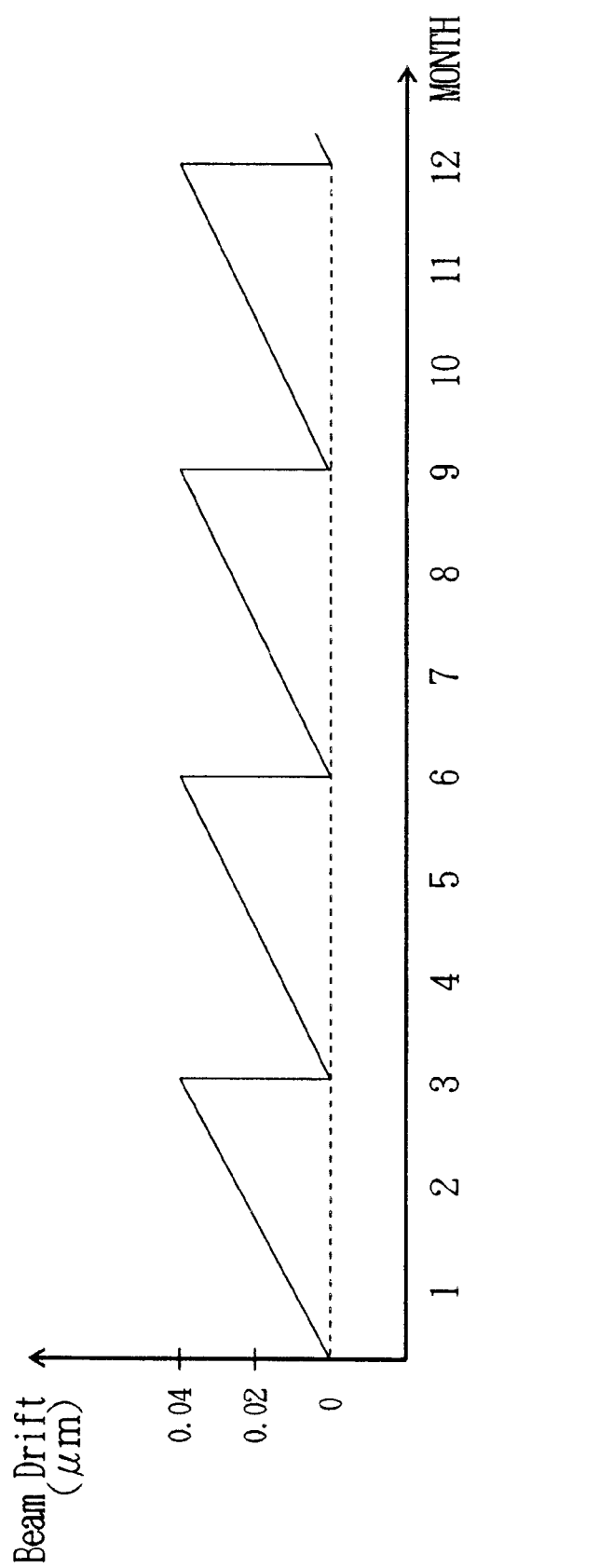

CHARGED PARTICLE BEAM EXPOSURE METHOD AND APPARATUS THEREFOR

BACKGROUND OF THE INVENTION

1. Field of the Invention

The present invention relates to an exposure method and a apparatus that employs a charged particle beam, such as an electron beam, and in particular to an exposure method and apparatus whereby beam drift, due to the deposit in an apparatus of a contaminating substance, or substances, can be prevented.

2. Related Arts

As a result of the high level integration required for an integrated circuit, there is a need for additional development of micromachining techniques. One of the current micromachining techniques used involves exposing a wafer or a reticle mask by irradiating it with a charged particle beam, such as an electron beam. But, in order to respond to a future need for super-micromachining techniques, it may become necessary to expose a wafer directly by the beam.

Although the present invention can be widely applied for wafer exposure using a charged particle beam, the term "electron beam" will be used hereinafter instead of "charged particle beam" to simplify the explanation. In an electron beam exposure apparatus, electrons are produced by an electron gun and are accelerated by an electric field so as to generate an erectron beam. The shape and the direction of the electron beam are controlled by an electromagnetic lens and a deflector, both of which are provided in a lens barrel. Normally, an electron beam is shaped and given a rectangular cross section by being passed through a first slit that has a specified rectangular shape. The electron beam is then formed and given an exposure pattern cross section by being passed through a second slit, or a blanking aperture array (BAA) mask (a transmission mask, as a general term) having a predetermined mask pattern shapes While the half angle of convergence of the electron beam, which now has the exposure pattern cross section, is restricted by a round aperture, or diaphragm, the electron beam is passed through a projection lens and a deflector at the final stage, and is irradiated to a sample, such as a wafer or a reticle mask. For electron beam exposure, it is known that micromachining of an area of about 0.05 $\mu$m or smaller can be performed with a positioning accuracy of 0.02 $\mu$m or less.

However, it is also known that the positioning accuracy of an electron beam is progressively degraded as time elapses. The primary factor contributing to the degradation of accuracy is a positioning shift of the electron beam, commonly known as "beam drift". One of the primary causes of beam drift is a charge-up drift caused by contamination at an electrostatic deflecting electrode in the vicinity of a projection lens or in the lower portion of a lens barrel. Another cause is a charge-up drift that occurs upstream from the projection lens.

FIG. 9 is a schematic diagram illustrating a projection lens in an exposure apparatus. A main chamber 4 is used to store a wafer W, as a sample, and a vacuum is maintained therein by a turbo molecular pump P3. A portion 71 is in atmospheric pressure, and stores a projection lens 32, which is an electromagnetic lens for example, and a main deflector 33. Further, a sub-deflector 34 and its cover 70 are provided in an evacuated mirror column. An electron beam EB is irradiated to desired locations on the surface of the wafer W by the projection lens 32 and the main and sub-deflectors 33 and 34.

The surface of the wafer W is normally coated with a resist film composed of organic material. When the wafer W is irradiated with a high energy electron beam, a gas is generated from the organic material. The gas generated from the organic material either attaches to the surface of the cover 70 and the surfaces of other components, or a carbon element in the gas is evaporated by reflected electrons. As a result, a highly insulating contaminant CON is generated on the surface of the cover 70. When charges, such as reflected electrons and secondary electrons, are accumulated in the contamination CON, an electric field is produced around the contamination. The electric field causes the position shift of the electron beam irradiated from above.

Contamination may also occur at the previously described round aperture, or diaphragm, etc., which is also provided upstream from the projection lens 32, in the same manner as described, affecting an electric field nearby.

The fluctuation of the distribution of the electric field causes the lateral drift of an electron beam and the defocusing of a beam.

These contaminants are accumulated over a long period of time. FIG. 10 is a graph showing the tendency of a change in a beam drift that occurs due to the contaminations. The horizontal axis represents time in months, and the vertical axis represents beam drift distance. As is shown by this graph, the beam drift distance tends to increase gradually over a period of several months. In the example in FIG. 10, since an exposure apparatus is cleaned every three months, the beam drift distance immediately after cleaning is 0. When almost three months have elapsed, however, the drift distance reaches 0.04 $\mu$m, which is too large for an electron beam exposure apparatus that performs micromachining.

As a method for removing such contamination, the present applicant proposed a method for cleaning all components of an exposure apparatus by introducing oxygen into the apparatus and inducing plasma excitation (e.g., Japanese Patent Application No. Hei 5-138755, U.S. Pat. No. 5,401,974). When utilizing a cleaning method using plasma etching, however, the cleaning is not performed until a drift value has reached a specific level, and therefore the drift occuring up to that time can not be avoided. If the apparatus is cleaned frequently, so as to reduce the drift distance as much as possible, the availability factor for the electron beam exposure apparatus is reduced. Further, since the generation of a high frequency current accompanies plasma excitation, the metal plated on a ceramic portion of an electrode or a barrel is sputtered. As a result, these components must be replaced after a certain number of cleanings.

SUMMARY OF THE INVENTION

To resolve the above described shortcomings, it is one object of the present invention to provide a charged particle beam exposure method and apparatus whereby an increase in beam drift distance can be prevented.

It is another object of the present invention to provide a charged particle beam exposure method and apparatus whereby ozone is introduced into a lens barrel and a main chamber for the simultaneous performance of cleaning exposure, and whereby malignant influences due to the introduction of ozone can be prevented.

It is an additional object of the present invention to provide a charged particle beam exposure method and apparatus whereby a cathode of an electron gun can be protected from being damaged by the introduction of ozone.

It is a further object of the present invention to provide a charged particle beam exposure method and apparatus whereby metal components upstream along an electron beam can be prevented from being excessively oxidized by the introduction of ozone.

It is still another object of the present invention to provide a charged particle beam exposure method and apparatus in which there are surfaces of components which an electron beam does not reach even though the ozone introduction can be effectively cleaned.

To achieve the above objects, according to one aspect of the present invention, a charged particle beam exposure method, wherein a charged particle beam is shaped based on pattern data and the shaped charged particle beam is irradiated to a desired location on a sample, comprises the steps of: separating, in a vacuum, a first chamber which encloses an electron gun for generating a charged particle beam, and a second chamber through which the charged particle beam is passed and in which the charged particle beam is shaped and deflected so as to be irradiated to the desired location on the sample; and introducing ozone gas into the second chamber.

Since ozone gas is not introduced into the first chamber in which the electron gun is stored, oxidization of and damage to the cathode of the gun can be prevented from occurring.

According to another aspect of the present invention, a charged particle beam exposure method, wherein a charged particle beam is shaped based on pattern data and the shaped charged particle beam is irradiated to a desired location on a sample, comprises the steps of: introducing ozone gas into a chamber, through which the charged particle beam is passed and in which the charged particle beam is shaped and deflected so as to be irradiated to the desired location; and setting the ozone gas concentration in the chamber so that the concentration downstream along the charged particle beam is higher than the concentration upstream along the charged particle beam.

The above object is also achieved by an alternative method for charged particle beam expdsure wherein the concentration of ozone gas in the chamber in an area where the current of the charged particle beam is small is higher than in an area where the current of the charged particle beam is large.

As a result, since the concentration of ozone gas is low in the upstream chamber where the current of the charged particle beam is large, damage to the components caused by oxidation of active oxygen can be prevented, and an adequate amount of ozone gas for self-cleaning can be supplied downstream, where the current of the charged particle beam is small.

According to an additional aspect of the present invention, a charged particle beam exposure method, wherein a charged particle beam is shaped based on pattern data and the shaped charged particle beam is irradiated to a desired location on a sample, comprises the steps of: introducing ozone gas into a chamber through which the charged particle beam is passed and in which a high vacuum is maintained; and introducing gas for scattering the charged particle beam passing through the chamber. The gas for scattering includes either oxygen or one of the rare gases, such as helium, argon, or neon.

With this method, a charged particle beam is scattered in the chamber, and as active oxygen can be supplied to the surfaces of components that are conventionally located behind a beam stream, the apparatus can be cleaned thoroughly.

The objects of the present invention can be achieved by an exposure apparatus that employs the above exposure methods.

BRIEF DESCRIPTION OF THE DRAWINGS

FIG. 10 is a graph showing change of beam drift as time elapses.

DETAILED DESCRIPTION OF THE PREFERRED EMBODIMENT

The preferred embodiment of the present invention will now be described while referring to the accompanying drawings. The technical scope of the present invention, however, is not limited to this embodiment. An explanation will be given for the employment of an electron beam, which is one type of charged particle beam.

Figure 1:
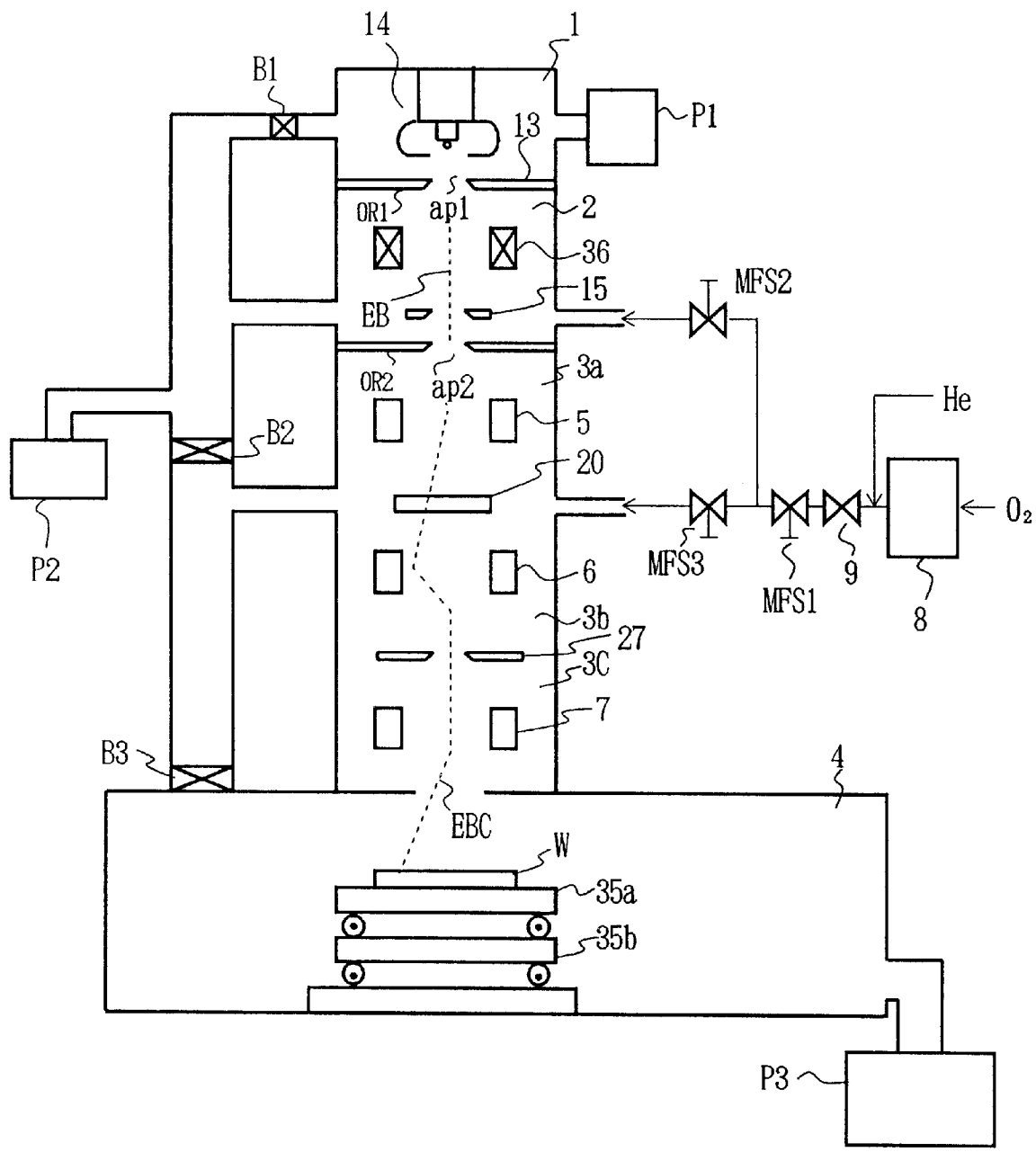
FIG. 1 is a schematic diagram illustrating an electron beam exposure apparatus according to one embodiment of the present invention.

FIG. 1 is a schematic diagram illustrating an electron beam exposure apparatus that is used for explaining one embodiment of the present invention. The electron beam exposure apparatus comprises a lens barrel constituted by a chamber 1 which stores an electron gun 14, a chamber 2 which stores an alignment lens 36 and a first slit 15, and chambers 3a, 3b and 3c which store a deflector 5, a second slit or mask 20, a deflector 6, a round aperture diaphragm 27, a projection lens and a deflector 7. A main chamber 4 stores a wafer W and stages 35a and 35b which move in directions X and Y while holding the wafer W.

A molecular turbo pump P2 produces a vacuum mainly in the lens barrel, and a molecular turbo pump P3 forms a vacuum primarily in the main chamber 4, which has a greater volume than the mirror barrel. An ion pump P1 maintains the evacuated condition in the chamber 1 of the electron gun 14. The ion pump P1 can not form a vacuum by evacuating the air in chamber 1 with air pressure, but can maintain the evacuated condition of the chamber 1 once the molecular turbo pump P2 has produced a vacuum to a degree. Although the principle of the ion pump P1 is well known and is not therefore described in detail, in short, an ionized metalic material, such as titanium, is used in the ion pump P1 to absorb gas in order to maintain an evacuated condition.

The principle of the electron beam exposure apparatus is as follows. The chambers of the lens barrel are evacuated to obtain a high vacuum of, for example, $1 \times 10^{-5}$ Torr (about $1 \times 10^{-3}$ Pa), and an electron beam is emitted by the electron gun 14. The emitted electron beam is aligned along the axis, and is shaped to provide a predetermined rectangular beam by the first slit 15. The rectangular beam is deflected and directed to the second slit or a desired position of the mask 20, as is indicated by the broken line, with the result that the electron beam has a pattern where the first slit 15 and the second slit or the mask 20 are overlapped. Finally, the path of the electron beam is restricted by the round aperture diaphragm 27, and the electron beam is focused on a desired location on the wafer W by the projection lens and the deflector 7.

In this embodiment, ozone is introduced into the chambers of the electron beam exposure apparatus. The introduced ozone is separated into oxygen and activated oxygen by collision with an electron beam. The activated oxygen reacts with the carbon contamination that has accumulated on or has been deposited on the surface of the components. The reacted gas thereby is diffused as carbon oxide gas or carbon dioxide gas so that the occurrence of a beam drift is prevented. An ozonizer 8 generates ozone, which is introduced into the chambers through a valve 9 that is freely opened and closed, and through mass flow sensors MFS 1, 2 and 3.

However, there are problems that arise from the introduction of ozone. First, the activated oxygen generated by the introduction of ozone has an malignant influence where it, induces oxidization of the cathode electrode of an electron gun. Since a high voltage is applied to the cathode electrode of the electron gun and its temperature is therefore high (e.g., 1600° C.), ozone must be prevented from entering the chamber 1 where the electron gun 14 is located.

Second, because of the presence of ozone, metal components will be quickly oxidized in the upstream area of the electron beam, where the volume of the electron beam emission is large. It is preferable that the ozone cleaning is performed in the vicinity of the projection lens facing the wafer W where the primary contamination occurs. On the downstream side of the electron beam, the electron beam is weak and therefore the amount of activated oxygen generated from ozone is also reduced, whereas on the upstream side, where frequent cleaning is not required, the electron beam is strong, and accordingly a large amount of activated oxygen is generated so that the first slit plate 15 for example must be frequently replaced because of the oxidization.

Third, while various components are included in the apparatus, not all portions are irradiated by an electron beam or resulting reflected electrons. That is, in a high vacuum where an electron beam becomes a molecular flow, the electron beam is only directed only forward, in accordance with the distribution of the electric field. Therefore, it is difficult for contamination on the portions behind the electron beam flow to be removed merely by introducing ozone.

To resolve the first problem, in this embodiment, the chamber 1 in which the electron gun 14 is located is separated in a vacuum from the other chambers 2, 3 and 4, so that ozone is introduced only into the chambers 2, 3 and 4. More specifically, an orifice OR1 is provided at an aperture AP1 for an anode electrode 13, which defines a boundary between the chamber 1 in which the electron gun 14 is located and the chamber 2 below it. By using the orifice OR1, the size of the aperture AP1 is maintained as small as possible. Furthermore, a valve B1 provided between the molecular turbo pump P2 and the chamber 1 is opened when a vacuum is produced by the evacuation of air, and is closed when a specifically high vacuum is attained in the chamber 1, so that the high vacuum condition is maintained in the chamber 1 by the ion pump P1.

In this manner, the conductance of the molecular flow becomes extremely high at the aperture AP1, which is reduced in size by the orifice OR1. In addition, as the valve B1 is closed, ozone supplied to chambers 2 and 3 is not introduced into chamber 1 in which the electron gun 14 is located. A high vacuum is maintained in the chamber 1 in which the electron gun 14 is located, and a lower vacuum is maintained in the other chambers 2 and 3. In other words, air is exhausted from chambers 1 and 2 under different pressures.

Figure 2:
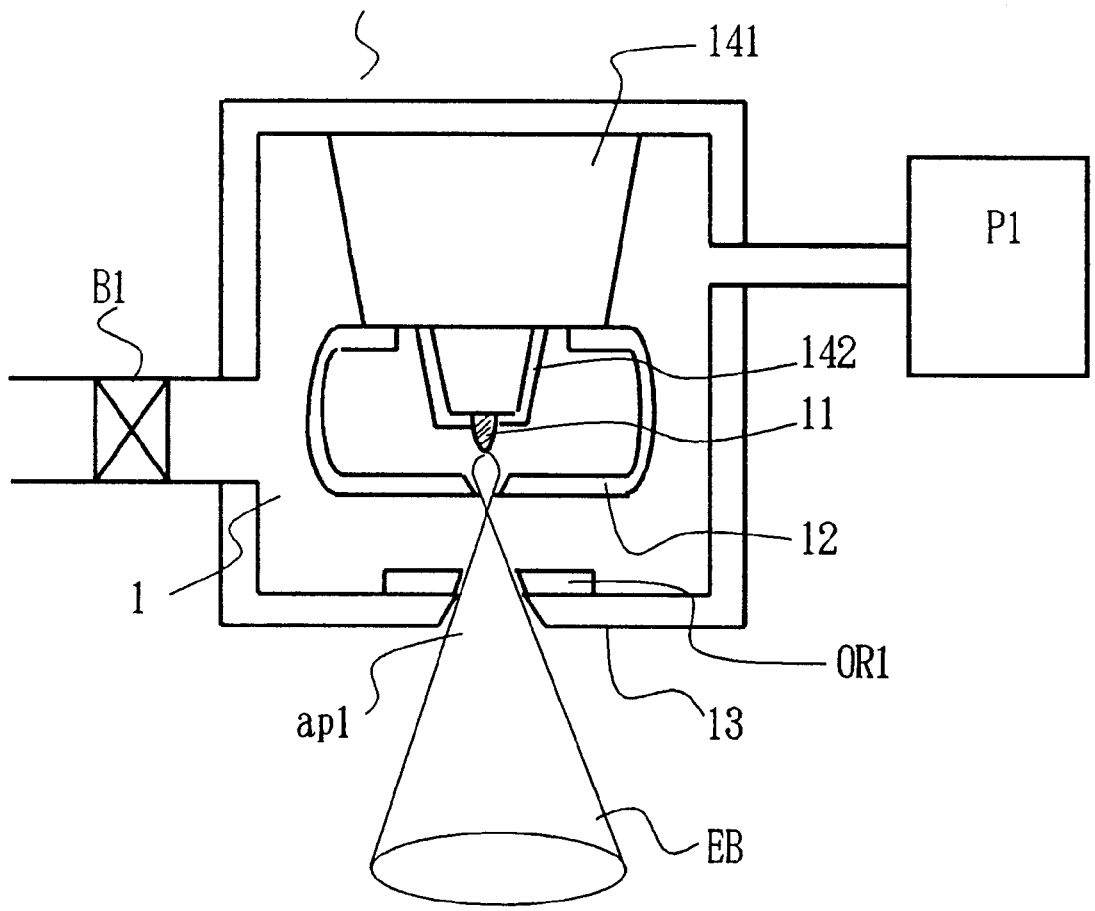
FIG. 2 is a schematic diagram illustrating an electron gun.

FIG. 2 is a schematic diagram illustrating the electron gun 14. As a high voltage is applied to the electron gun 14, it comprises a filament 142 carried via glass 141 from a case; a cathode electrode 11 formed of LaB6; a grid 12 for restricting an electron beam; and an anode electrode 13 for accelerating the electron beam. In this embodiment, an orifice OR1 is provided at the anode electrode 13 to reostrict the aperture AP1.

With the preceding arrangement, the second problem, where the metal components upstream of the electron beam are oxidized, can be resolved. More specifically, a higher vacuum is maintained in the upstream chamber, where the volume of the electron beam is the greatest, and a lower vacuum is maintained in the downstream chamber, where the electron beam volume is smaller but contaminants tend to be deposited. Further, the mass flow sensors MFS2 and MFS3 are controlled as needed to reduce a flow rate in mass flow sensor MFS2. In this manner, the concentration of ozone in each chamber is controlled to be inversely proportional to the volume of the electron beam. As a result, damage to the upstream metal components due to oxidation can be avoided.

Furthermore, the second problem can also be resolved in such a manner that, regardless of whether on the upstream or the downstream side, the concentration of ozone gas is low in a chamber where the electron beam has a large current, and the concentration of ozone gas is high in a chamber where the electron beam has a small current.

Figure 3:
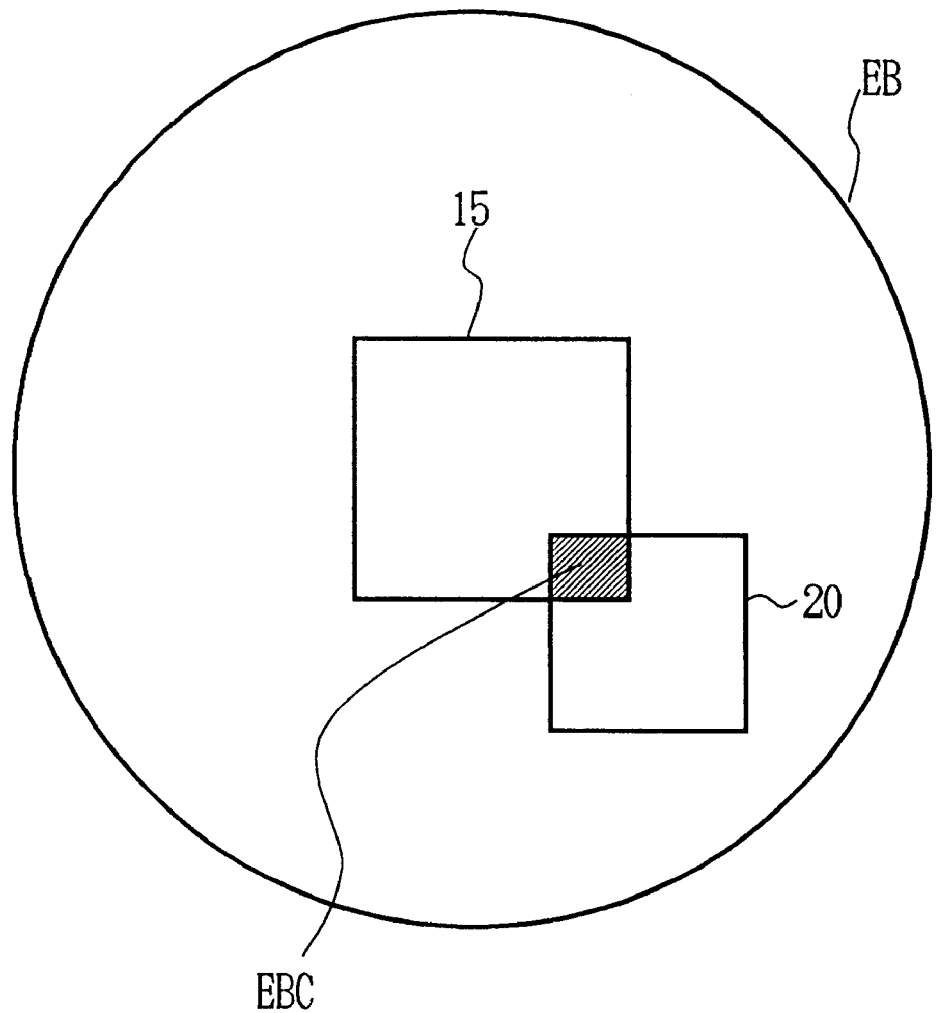
FIG. 3 is a diagram showing the relationship between first and second slits and an electron beam.

FIG. 3 is a diagram showing the relationship between an electron beam and the first and the second slits. An electron beam EB emitted by the electron gun 14 is given a specific rectangular shape by the first slit 15. The electron beam EB is then formed into an electron beam having a pattern shape EBC in which the first slit 15 and the second slit or the mask 20 are overlapped. The formed electron beam EBC is restricted by the round aperture 27 in FIG. 1, and is reduced by the projection lens 7, and the resultant beam is irradiated on the wafer W.

An electron beam volume is large on the upstream side of the beam in FIG. 1, and is small on the downstream side. Therefore, when ozone is introduced at the same concentration upstream and downstream, first, the influence of oxidization due to ozone can not be disregarded on the upstream side. Second, although the the upstream electron beam is reduced later, the the electron beam just before the projection lens 7, at the final stage, can not be reduced any further. Therefore, even when a charge-up drift occurs upstream due to contamination, the the electron beam is reduced later and the drift distance is reduced accordingly. On the other hand, since a charge-up drift occurring at the final stage is not reduced, the drift at the final stage has an adverse and great effect on an exposure pattern.

In this embodiment, therefore, the concentration of ozone is low upstream along an electron beam so that the influence due to oxidization is reduced to a minimum, even through the self-cleaning effect is not so great, and the concentration of ozone is high downstream so as to obtain the maximum self-cleaning effect. Further, since the volume along a downstream side of the electron beam is small, despite having a higher concentration of ozone, the adverse affect due to oxidization will not be as great as on the upstream side.

Specifically, as is shown in FIG. 1, ozone is introduced to the chamber 2 in which the first slit 15 is located, and to the downstream chamber 3 via the mass flow sensors MFS 2 and MFS3 respectively. In this case, the flow rate of the ozone through the mass flow sensor MFS2 is lower than that through the flow sensor MFS3. Further, a second orifice OR2 is located between chamber 2 and chamber 3 to restrict the aperture AP2 so as to increase molecular flow conductance. A medium vacuum is provided for chamber 2 by reducing the degree of opening of valve B2, while a low vacuum is provided for chambers 3 and 4.

Specific vacuum in each chamber is as follows:

Chamber 1: $1 \times 10^{-7} - 1 \times 10^{-6}$ Torr

Chamber 2: $1 \times 10^{-6} - 5 \times 10^{-6}$ Torr

Chamber 3, 4: $5 \times 10^{-6} - 2 \times 10^{-5}$ Torr.

As an example volume for an electron beam, suppose that the volume of an electron beam emitted by the electron gun 14 is 1 mA, and the electron beam is, for example, 20 $\mu$A when passed through the first slit 15. When the electron beam is then passed through the second slit or the mask 20, the electron beam is, for example, 10 $\mu$A, and as it is being passed though the round aperture 27, the electron beam is reduced to, for example, 5 $\mu$A.

As for the third problem concerning contamination at a hidden portions that are not directly irradiated by the electron beam from the electron gun, in this embodiment, helium gas (He), one of the rare gases, is introduced in addition to ozone. As was previously described, a high vacuum is maintained in the electron beam exposure apparatus where a molecular flow is provided without a viscous flow. In this manner, the emission of the linear electron beam EB is ensured. However, the electron beam EB is emitted only linearly downstream, and only reflected electrons, which are reflected by a slit plate and an aperture plate, and the associated secondary electrons are scattered. Therefore the electron beam EB is not supplied to the hidden portions, so that not all the internal components can be thoroughly cleaned.

Figure 4:
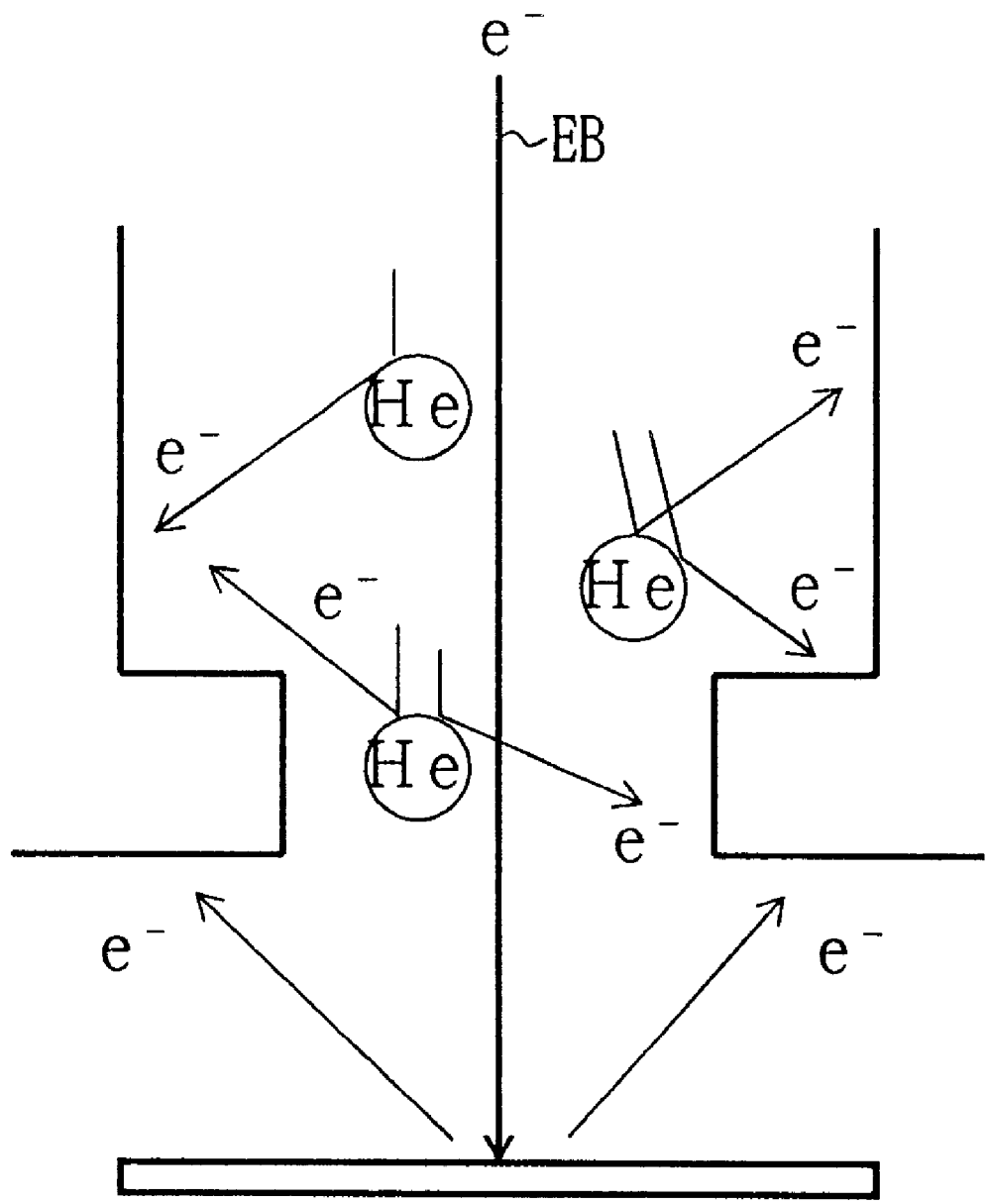
FIG. 4 is a diagram showing electron beam scattering.

FIG. 4 is a diagram for explaining the scattering of the electron beam EB by the introduction of helium. As is shown in FIG. 4, since the electron beam EB is scattered by the introduction of heilium, which is one of the rare gases, the hidden portions can also be cleaned. The gas introduced with ozone is not limited to helium, but may be another rare gas, such as neon or argon. When oxygen $O_2$ is introduced, the electron beam can be scattered without having any adverse affect on the apparatus. However, since nitrogen (N) is an atom that in the chamber carries a positive charge, even though it is inert, positive ions of nitrogen are accelerated in the direction opposite to the flow of the electron beam, strike the electron gun 14, and damage the cathode electrode at the distal end of the electron gun 14. Nitrogen, therefore, is not a gas that would preferably be employed.

The above described electron beam exposure apparatus is employed to perform normal electron beam exposure while a mixture of ozone and another gas is introduced into the apparatus to scatter the electron beam. As soon as contamination caused by the exposure process is deposited, cleaning is performed by using the activated oxygen generated from ozone. Therefore, when ozone gas is so introduced as to balance the degree to which contaminants are deposited and the degree to which cleaning is performed, beam drift in the horizontal direction and in the vertical direction due to the above described charge-up drift can be prevented. Further, damage to the electron gun due to the introduction of ozone can be prevented, and oxidization damage to metal components along the upstream side of the beam can also be prevented.

[Specific arrangement]

The detailed arrangement of the electron beam exposure apparatus according to the embodiment of the present invention will now be explained while referring the accompanying drawings.

Figure 5:
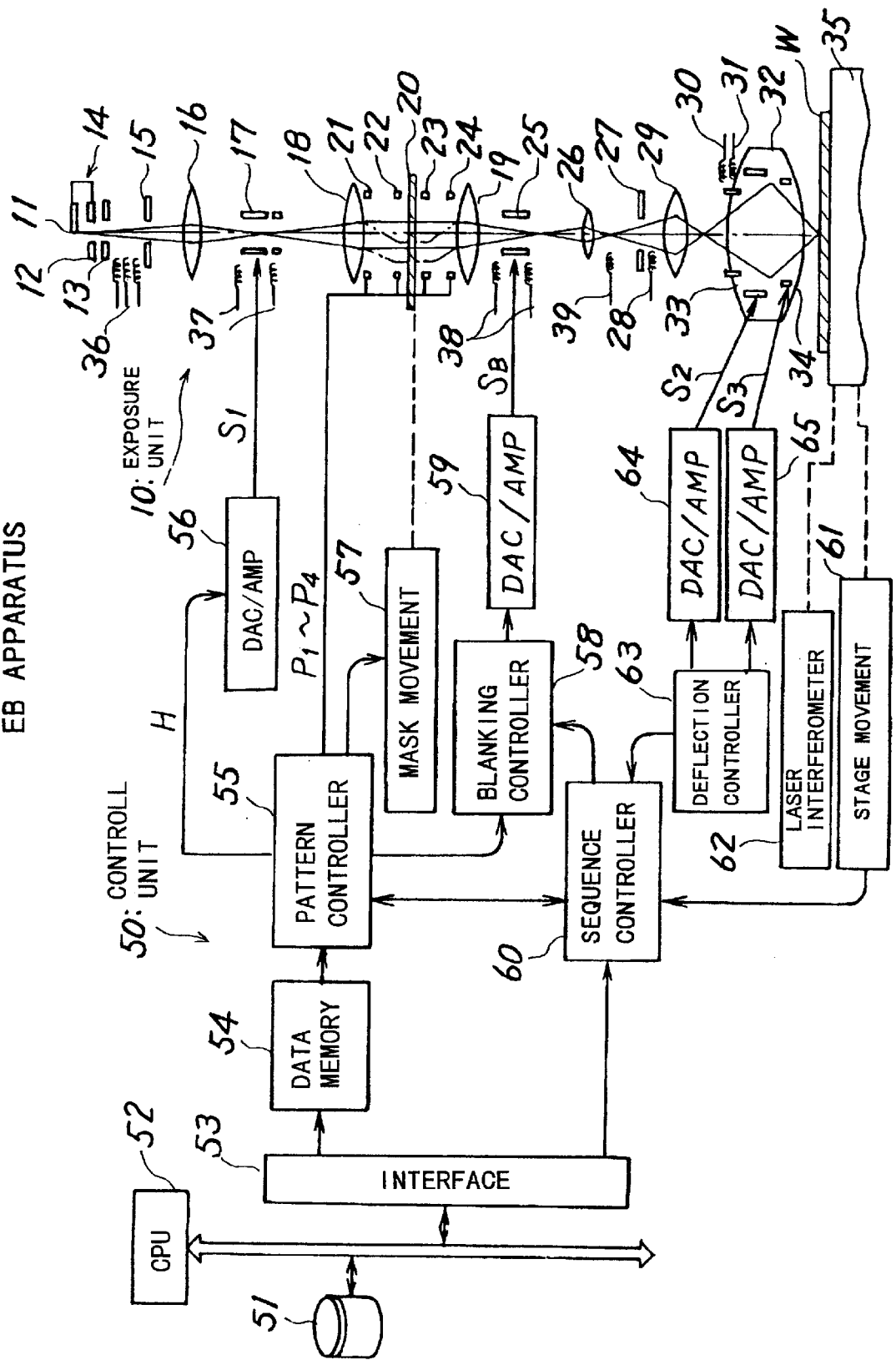
FIG. 5 is a diagram illustrating the overall structure of the electron beam exposure apparatus.

FIG. 5. is a diagram illustrating the overall structure of the electron beam exposure apparatus. Athough the present invention can be applied to an exposure apparatus that utilizes a charged particle beam, an electron beam exposure apparatus is explained as an example. The exposure apparatus includes an exposure unit 10 and a control unit 50. Lenses and deflectors provided in the exposure unit 10 are controlled by the control unit 50. In the control unit 50, pattern data recorded on a recording medium, such as a disk, are input via an interface 53, and are converted into drive signals required for the exposure process. The lenses and the deflector in the exposure unit 10 are driven in accordance with the drive signals.

Figure 6:
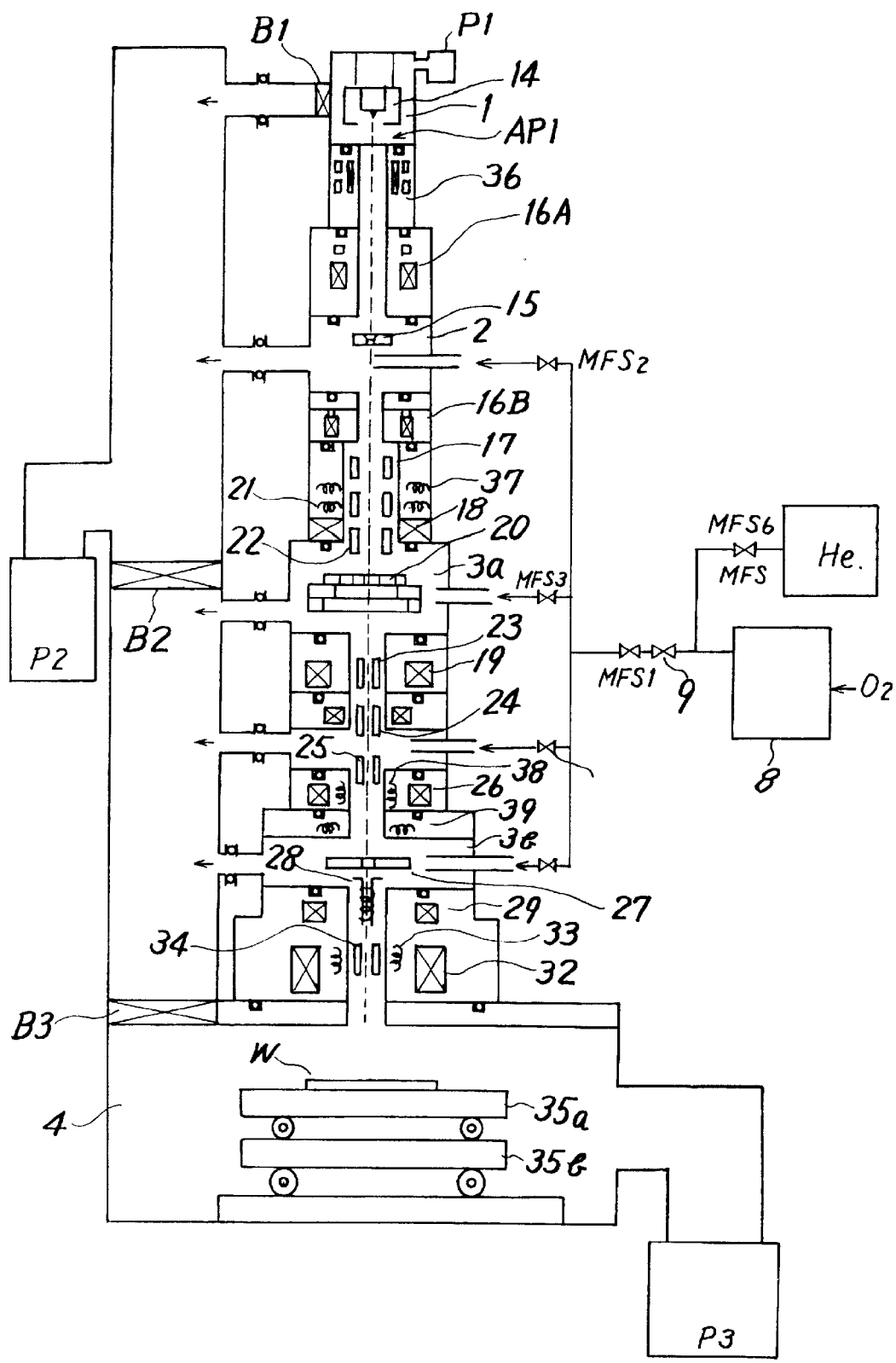
FIG. 6 is a detailed diagram illustrating the structure of the electron beam exposure apparatus.

FIGS. 6 is a diagram wherein the exposure unit 10 is specifically illustrated. The structure of the exposure unit 10 can be better understood by referring to FIG. 6 during the course of the explanation.

First, the exposure unit 10 will be explained. The electron gun 14, an electron beam generating source, includes the cathode electrode 11, the grid electrode 12 and the anode electrode 13, as is described above. An orifice is located at the cathode electrode 13, and the opening of its aperture AP1 is restricted. The electron beam is projected to the first slit 15 through the alignment lens 36 for axis matching and a lens 16A (not shown in FIG. 5). The first slit 15 normally has a rectangularly shaped aperture by which the electron beam is given a rectangular shape. The rectangular beam enters a slit deflector 17 after passing through a lens 16B. The slit deflector 17 is controlled by a corrected deflection signal S1. Reference numeral 37 denotes an alignment coil.

The transmission mask 20, which has a plurality of through holes, such as a rectangular opening and a predetermined block pattern opening, is used as a pattern to give an electron beam a desired shape. In order to deflect the electron beam to a desired pattern opening position, electromagnetic lenses 18 and 19 and deflectors 21 through 24 are provided above and below the transmission mask 20. The transmission mask 20 is mounted on a stage that is movable in the horizontal direction.

The irradiation to the wafer W with the electron beam shaped in the above described manner is controlled by a blanking electrode 25 to which a blanking signal SB is supplied. Reference numeral 38 denotes another alignment coil.

The electron beam, maintained in the ON state by the blanking electrode 25, passes through a lens 26 and the round aperture diaphragm 27. The round aperture diaphragm 27 is a type of diaphragm for which the size of the opening can be controlled to a degree. The convergent half angle of an electron beam is controlled with this round aperture diaphragm 27. The beam shape is finally adjusted by a refocal coil 28 and an electromagnetic lens 29. A focus coil 30 is used to focus an electron beam on a target surface to be exposed, and a sting coil 31 corrects for astigmatism.

At the final stage, the electron beam is reduced to the size required for an exposure by the projection lens 32, and is focused so that it is irradiated on a correct position on the surface of the wafer W by the main deflector 33 and the sub-deflector 34, which are controlled by exposure position determination signals S2 and S3. The main deflector 33 is an electromagnetic deflector, and the sub-deflector 34 is an electrostatic deflector.

Next, the control unit 50 will be explained. As was previously described, the exposure pattern data are stored in a memory 51, and are read and executed by a CPU 52. The obtained drawing data are transmitted to a data memory 54 and a sequence controller 60 via an interface 53. The drawing data contain at the least data indicating a position on the wafer W to be exposed by the electron beam, and mask data indicating a selected pattern on the transmission mask 20.

A pattern controller 55 transmits to the deflectors 21 through 24, in accordance with the mask data to be drawn, position signals P1 through P4, each of which designates one of the through holes in the transmission mask 20. The pattern controller 55 also calculates a compensation value H that is accordant with a difference between a pattern shape to be drawn and a shape of the designated through holes, and transmits the compensation value H to a digital-analog converter and an amplifier 56. The amplifier 56 sends a corrected deflection signal Si to the deflector 17. Further, in accordance with the positions of the selected through holes, the pattern controller 55 controls a mask moving mechanism 57 to shift the transmission mask 20 in the horizontal direction.

In response to a control signal from the pattern controller 55, a blanking control circuit 58 transmits a blanking signal SB to the blanking electrode 25 via an amplifier 59. Then, the ON/OFF state of the electron beam irradiation is controlled.

The sequence controller 60 receives data from the interface 53 indicating a position for drawing, and provides control for a drawing process sequence. A stage moving mechanism 61 moves the stage 35 in the horizontal direction in accordance with a control signal from the sequence controller 60. The shifting distance for the stage 35 is detected by a laser interferometer 62, and is transmitted to a deflection control circuit 63. The deflection control circuit 63 transmits deflection signals S2 and S3 to the main deflector 33 and the sub-deflector 34 respectively in consonance with the moving distance for the stage and the exposure position data that are received from the sequence controller 60. Generally, a deflection square field of, for example, 2 to 10 mm is deflected by the main deflector 33, and a square sub-field of, for example, 100 $\mu$m is deflected by the sub-deflector 34.

Unlike as shown in FIG. 1, in the detailed diagram in FIG. 6 showing the structure of the electron beam exposure apparatus, ozone gas generated by the ozonizer 8 is supplied to the chambers 2, 3a, 3c and 3b through the mass flow sensors MFS2, MFS3, MFS4 and MFS5 respectively. The volume of the electron beam is reduced in the order of the chambers 2, 3a, 3c and 3b. Since the volume of the electron beam is large in the upstream chamber, the ozone gas that is to be supplied thereto is reduced. The other operation is the same as that in FIG. 1.

Figure 7:
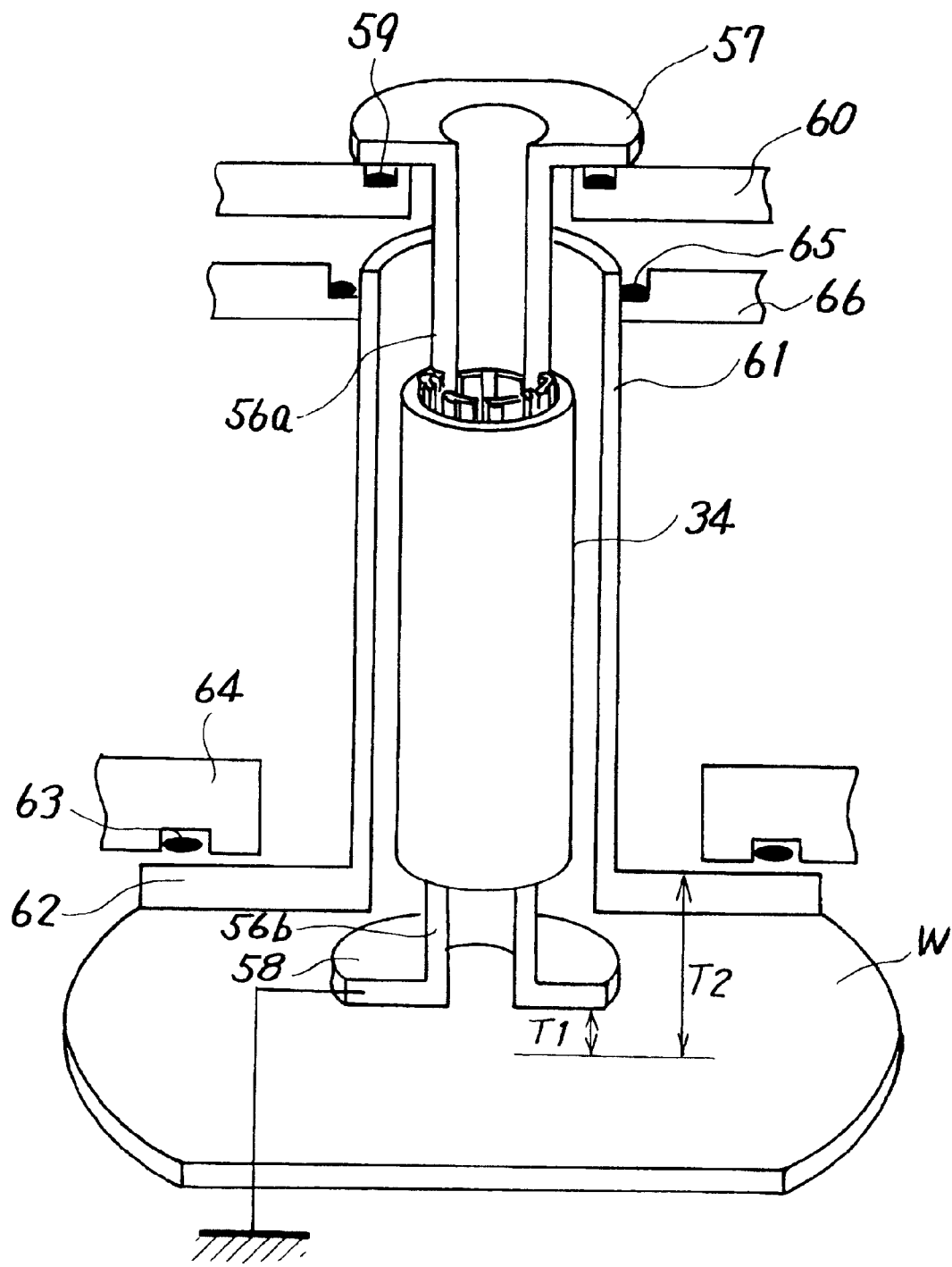
FIG. 7 is a diagram illustrating the structures of a subdeflector and its periphery.

FIG. 7 is a diagram illustrating an example structure of the sub-deflector 34 and its periphery. The sub-deflector 34 directly faces the wafer W, which is a sample, and is one of the portions where contamination tends to be easily deposited by gas generated by a coated resist on the wafer surface.

A cylindrical component 56a made of an insulating material is located in the upper portion of the sub-deflector 34 in FIG. 7. The cylindrical component 56a is hollow, and has a flange 57 on its top end. The surfaces of these components are plated with conductive film. The flange 57 is fixed to a frame member 60 of the exposure apparatus through an O ring 59. Another cylindrical component 56b made of an insulating material is located in the lower portion of the sub-deflector 34, and is also provided with a flange 58. The flange 58 directly faces the wafer W, which is a sample, and is positioned at the lowermost end of the lens barrel. These components are also plated with conductive film and are grounded.

The sub-deflector 34 is covered with another cylindrical component 61 made of an insulating material. A flange 62 located at the bottom end of the cylindrical component 61 is fixed to a frame member 64 through an O ring 63. The frame members 60, 64 and 66 are formed of an insulating material.

The structure inside the lens barrel is extremely complicated and intricate, and components made of an insulating material are located everywhere. Thus, contaminants generated from a resist, etc., and containing carbon as the prime element. are deposited on the surfaces of these components, and this produces a charge-up drift. In order to clean the surfaces of the internal components in the complicated structure, it is necessary to scatter an electron gas by using helium, etc.

Figure 8:
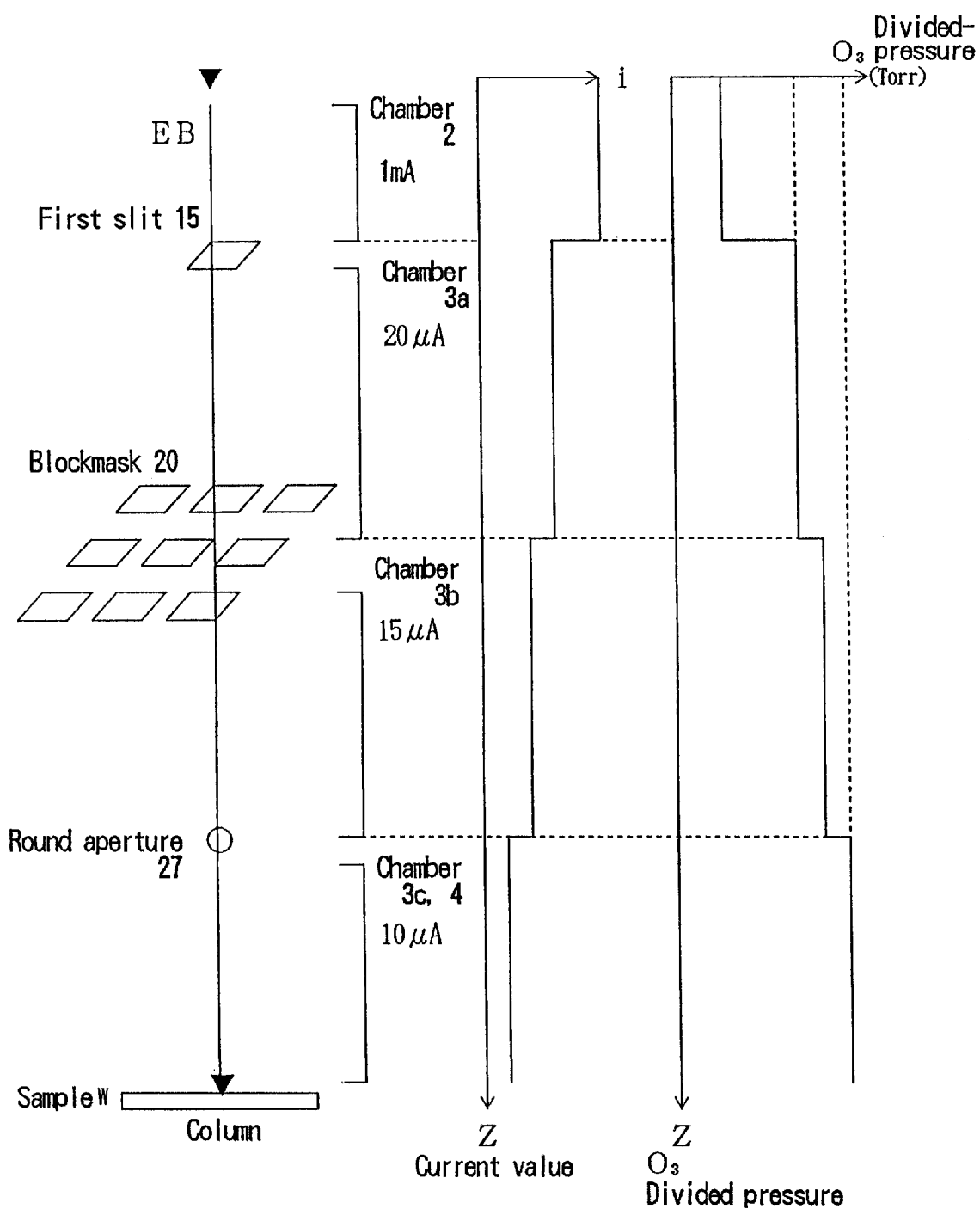
FIG. 8 is a schematic diagram showing the relationship between each area in a column of a lens barrel of the electron beam exposure apparatus, and a current value and an ozone divided-pressure value.
Figure 9:
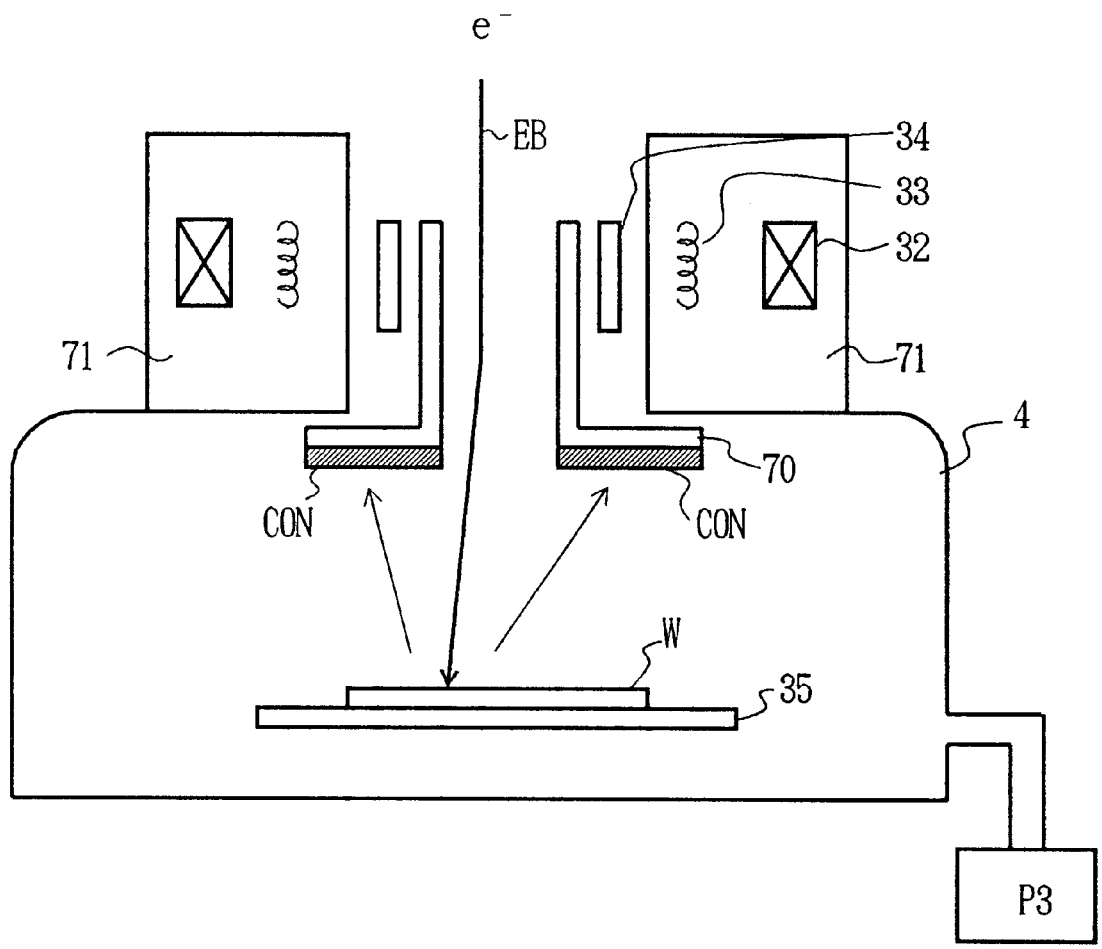
FIG. 9 is a diagram illustrating an electron beam exposure apparatus for explaining problems.

FIG. 8 is a schematic diagram showing the relationship between each area in a column composed of the lens barrel of the electron beam exposure apparatus, and a current value and an ozone divided-pressure value (concentration).

The individual areas, with the exception of the electron gun chamber, are shown in the column. In this example, the column is separated into four areas: the chamber 2, which is defined by the first slit 15; the chamber 3a, which is defined by the block mask 20, the second slit; the chamber 3b, which is defined by the round aperture 27; and the downstream chambers 3c and 4, in which the sample W is stored. The current of an electron beam in the individual areas is reduced as the electron beam passes through the corresponding slits or mask, and an example current strength for the electron beam in each area is shown in FIG. 8. As is apparent from FIG. 8, the concentration of ozone (divided pressure) is increased as the strength of the current is reduced. In other words, the concentration of ozone is reduced in an area in which the current of the electron beam is high, and the concentration of ozone is increased in an area in which the current of an electron beam is low.

When the exposure process is performed by using the above described electron beam exposure apparatus, the build up of beam drift that occurs as time elapses can be avoided. In other words, the beam drift change increasing over a period of time, such as is indicated by the broken line in FIG. 10, seldom occurs. Therefore, the periodical cleaning and overhaul conventionally performed is not required.

As is described above, according to the present invention, the deposit of contaminants in a charged particle beam exposure apparatus, which is induced by the introduction of ozone, can be prevented. Therefore, the occurrence of beam drift caused by the acquisition of electric charges by the contamination can be prevented. As a result, the availability factor of an exposure apparatus can be substantially increased.

What we claim:

1. A charged particle beam exposure method, wherein a charged particle beam is shaped based on pattern data, and the shaped charged particle beam is irradiated to a desired location on a sample, the method comprising the steps of:

separating, in a vacuum, a first chamber which encloses an electron gun for generating a charged particle beam, and a second chamber through which the charged particle beam is passed, shaped and deflected so as to be irradiated to the desired location;

introducing ozone gas into the second chamber while the charged particle beam is being irradiated through the chamber; and maintaining, in the second chamber, a concentration of ozone gas at a downstream region along the charged particle beam, at a position where current of the charged particle beam is reduced, greater than a concentration of ozone gas upstream along the charged particle beam.

2. A charged particle beam exposure method of claim 1, further comprising the step of maintaining vacuum pressure in the second chamber higher than in the first chamber.

3. A charged particle beam exposure method of claim 2, further comprising an orifice, having a hole, positioned between the first chamber and the second chamber, wherein gas flow conductance at the hole is decreased.

4. A charged particle beam exposure method of claim 1, further comprising an orifice, having a hole, positioned between the first chamber and the second chamber, wherein gas flow conductance at the hole is decreased.

5. A charged particle beam exposure method of claim 1, wherein the ozone gas is introduced to the second chamber to react with the charged particle beam to form radicals.

6. A charged particle beam exposure method, wherein a charged particle beam is shaped based on pattern data, and the shaped charged particle beam is irradiated to a desired location on a sample, the method comprising the steps of:

introducing ozone gas into a chamber, through which the charged particle beam is passed, shaped and deflected so as to be irradiated to the desired location; and maintaining the ozone gas concentration in the chamber while the charged particle beam is being irradiated through the chamber so that the ozone gas concentration at a downstream region along the charged particle beam, at a position where current of the charged particle beam is reduced, is greater than the ozone gas concentration upstream along the charged particle beam.

7. A charged particle beam exposure method of claim 6, further comprising the step of maintaining pressure in the chamber so that the pressure at said position of the downstream region along the charged particle beam is greater than the pressure upstream along the charged particle beam.

8. A charged particle beam exposure method of claim 6, wherein the chamber is divided into said upstream region enclosing a first slit irradiated with the charged particle beam and said downstream region through which the charged particle beam passes after passing through the first slit, the method further comprising the step of maintaining vacuum conditions so that concentration of the ozone gas in the upstream region is lower than in the downstream region.

9. A charged particle beam exposure method of claim 8, further comprising the steps of:

introducing ozone gas into the upstream region and the downstream region respectively; and maintaining a flow rate of ozone gas introduced in the upstream region lower than in the downstream region.

10. A charged particle beam exposure method, wherein a charged particle beam is shaped based on pattern data, and the shaped charged particle beam is irradiated to a desired location on a sample, the method comprising the steps of:

introducing ozone gas into a chamber, through which the charged particle beam is passed, shaped and deflected so as to be irradiated to the desired location; and maintaining a higher concentration of ozone gas in an area where current of the charged particle beam is small than in an area where current of the charged particle beam is large while the charged particle beam is being irradiated through the chamber, wherein the concentrations of ozone gas are increased alone the charged particle beam at a position where charged particle beam current is decreased.

11. A charged particle beam exposure method of claim 10, further comprising the step of:

maintaining higher pressure in the area where the current of the charged particle beam is small than in the area where the current of the charged particle beam is large.

12. A charged particle beam exposure method, wherein a charged particle beam is shaped based on pattern data, and the shaped charged particle beam is irradiated to a desired location on a sample, the method comprising the steps of:

introducing ozone gas into a chamber through which the charged particle beam is passed and in which a high vacuum is maintained while the charged particle beam is being irradiated through the chamber; and introducing gas for scattering the charged particle beam passing through the chamber.

13. A charged particle beam exposure method of claim 12, wherein the gas for scattering the charged particle beam includes either oxygen or a rare gas from the group consisting of helium, argon, and neon.

14. A charged particle beam exposure apparatus, wherein a charged particle beam generated by a charged particle gun is shaped based on pattern data, and the shaped charged particle beam is irradiated to a desired location on a sample, comprising:

a first chamber enclosing the charged particle gun generating the charged particle beam;

a first vacuum pump for maintaining a first vacuum condition in the first chamber;

a second chamber in which the charged particle beam is passed, shaped and deflected so as to be irradiated to the desired location;

a second vacuum pump for maintaining a second vacuum condition in the second chamber having pressure higher than the first vacuum condition;

gas introduction means for introducing a concentration of ozone gas to the second chamber; and an orifice provided between the first and second chambers for dividing the chambers, wherein said ozone gas is introduced to the second chamber while the charged particle beam is being irradiated through the second chamber, and the concentration of ozone gas downstream along the charged particle beam in the second chamber, at a position where current of the charged particle beam is reduced, is greater than upstream along the beam.

15. A charged particle beam exposure apparatus, wherein a charged particle beam is shaped based on pattern data, and the shaped charged particle beam is irradiated to a desired location on a sample, comprising:

a chamber through which the charged particle beam is passed, the chamber being divided into an upstream chamber and a downstream chamber;

a vacuum pump for maintaining a first vacuum condition in the upstream chamber;

a vacuum pump for maintaining a second vacuum condition in the downstream chamber having pressure higher than the first vacuum condition; and gas introduction means for introducing a concentration of ozone gas to the chamber, wherein said ozone gas is introduced to the chamber while the charged particle beam is being irradiated through the chamber, and the concentration of ozone gas downstream along the charged particle beam in the chamber, at a position where current of the charged particle beam is reduced, is greater than upstream along the beam.

16. A charged particle beam exposure apparatus, wherein a charged particle beam is shaped based on pattern data, and the shaped charged particle beam is irradiated to a desired location on a sample, comprising:

a chamber through which the charged particle beam is passed, the chamber being divided into a region having large beam current and a region having small beam current;

a vacuum pump for maintaining a first vacuum condition in the region having the large beam current;

a vacuum pump for maintaining a second vacuum condition in the region having the small beam current, having pressure higher than the first vacuum condition; and gas introduction means for introducing concentrations of ozone gas to the chamber, wherein said ozone gas is introduced to the chamber while the charged particle beam is being irradiated through the chamber, wherein the concentrations of ozone gas are increased along the charged particle beam at a position where charged particle beam current is decreased.

17. A charged particle beam exposure apparatus, wherein a charged particle beam is shaped based on pattern data, and the shaped charged particle beam is irradiated to a desired location on a sample, comprising:

a vacuum chamber through which the charged particle beam is passed;

gas introduction means for introducing ozone gas to the chamber; and scattering gas introduction means for introducing gas for scattering the charged particle beam passing through the chamber, wherein said ozone gas is introduced to the chamber while the charzed particle beam is being irradiated through the chamber.

18. A charged particle beam exposure apparatus of claim 17, wherein the gas for scattering the charged particle beam includes either oxygen or a rare gas from the group consisting of helium, argon, and neon.

19. A charged particle beam exposure method, wherein a charged particle beam is shaped based on pattern data, and the shaped charged particle beam is irradiated to a desired location, the method comprising the steps of:

introducing ozone gas into a chamber, through which the charged particle beam is passed, shaped and deflected so as to be irradiated to the desired location; and maintaining an ozone gas concentration in the chamber that varies relative to current levels along the charged particle beam, while the charged particle beam is being irradiated through the chamber, so as to balance deposition of contaminates on parts within the chamber and an amount of cleaning of the parts performed as a result of the ozone gas maintained.

20. A charged particle beam exposure method of claim 19, wherein the concentration of ozone gas at a downstream region along the charged particle beam, at a position where current of the charged particle beam is reduced, is greater than upstream along the charged particle beam.

21. A charged particle beam exposure apparatus, comprising:

means for introducing ozone gas along a charged particle beam to remove contaminates from parts within the charged particle beam exposure apparatus; and means for controlling concentrations of the introduced ozone gas along the charged particle beam to vary the concentrations of ozone gas relative to current levels along the charged particle beam so as to balance the degree of deposition of contaminates in the chamber with the degree of cleaning the contaminates resulting from the introduced ozone gas.

* * * * *

UNITED STATES PATENT AND TRADEMARK OFFICE
CERTIFICATE OF CORRECTION

PATENT NO. : 5,981,960
DATED : November 9, 1999
INVENTOR(S) : Ooach et al.

It is certified that error appears in the above-identified patent and that said Letters Patent is hereby corrected as shown below:

On the title page item [73], add --Advantest Corporation, Tokyo, Japan--.

Signed and Sealed this

Eighteenth Day of July, 2000

Attest:

Q. TODD DICKINSON

*Attesting Officer*  *Director of Patents and Trademarks*